US012596180B2

(12) United States Patent
Fukuda

(10) Patent No.: US 12,596,180 B2
(45) Date of Patent: Apr. 7, 2026

(54) LIGHT RECEIVING ELEMENT AND ELECTRONIC DEVICE

(71) Applicant: SONY SEMICONDUCTOR SOLUTIONS CORPORATION, Kanagawa (JP)

(72) Inventor: Yasutaka Fukuda, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 790 days.

(21) Appl. No.: 17/999,933

(22) PCT Filed: Apr. 20, 2021

(86) PCT No.: PCT/JP2021/015962

§ 371 (c)(1),
(2) Date: Nov. 28, 2022

(87) PCT Pub. No.: WO2021/251004

PCT Pub. Date: Dec. 16, 2021

(65) Prior Publication Data

US 2023/0236291 A1     Jul. 27, 2023

(30) Foreign Application Priority Data

Jun. 8, 2020     (JP) ................................. 2020-099707

(51) Int. Cl.
*G01S 7/481*     (2006.01)
*H10F 39/00*     (2025.01)
*H10F 39/18*     (2025.01)
(52) U.S. Cl.
CPC .......... *G01S 7/4816* (2013.01); *H10F 39/184* (2025.01); *H10F 39/8027* (2025.01); *H10F 39/8057* (2025.01); *H10F 39/8063* (2025.01)

(58) Field of Classification Search
CPC .... G01S 7/4816; G01S 17/931; G01S 7/4914; G01S 17/36; G01S 17/894; H10F 39/184;
(Continued)

(56) References Cited

U.S. PATENT DOCUMENTS

2019/0342510 A1* 11/2019 Sano ..................... H10F 39/811
2020/0028017 A1* 1/2020 Imoto ..................... G01S 17/89

FOREIGN PATENT DOCUMENTS

JP      2018-117117 A      7/2018
JP      2020-516200 A      5/2020
WO      2020/017342 A1      1/2020

OTHER PUBLICATIONS

International Search Report and Written Opinion of PCT Application No. PCT/JP2021/015962, issued on Jul. 27, 2021, 09 pages of ISRWO.

* cited by examiner

*Primary Examiner* — Seung C Sohn
(74) *Attorney, Agent, or Firm* — CHIP LAW GROUP

(57)     ABSTRACT

A decrease in sensitivity of distance measurement is reduced. A light receiving element includes a first voltage application unit and a second voltage application unit, a first charge detection unit, and a second charge detection unit. The first voltage application unit and the second voltage application unit are configured in linear shapes extending in the same direction on the surface of the semiconductor substrate that performs photoelectric conversion of the incident light, are arranged apart from each other, and are provided with proximity portions and applied with different voltages. The first charge detection unit is arranged around the first voltage application unit on the surface of the semiconductor substrate and detects a charge generated by photoelectric conversion. The second charge detection unit is arranged around the second voltage application unit on the (Continued)

surface of the semiconductor substrate and detects a charge
generated by photoelectric conversion.

7 Claims, 11 Drawing Sheets

(58) Field of Classification Search
CPC ............. H10F 39/8027; H10F 39/8057; H10F
39/8063; H10F 30/20; H10F 39/12; H10F
39/8033; H10F 77/40; G01C 3/06; H04N
25/70
See application file for complete search history.

LIGHT RECEIVING ELEMENT AND ELECTRONIC DEVICE

CROSS REFERENCE TO RELATED APPLICATIONS

This application is a U.S. National Phase of International Patent Application No. PCT/JP2021/015962 filed on Apr. 20, 2021, which claims priority benefit of Japanese Patent Application No. JP 2020-099707 filed in the Japan Patent Office on Jun. 8, 2020. Each of the above-referenced applications is hereby incorporated herein by reference in its entirety.

TECHNICAL FIELD

The present disclosure relates to a light receiving element and an electronic device. Specifically, the present disclosure relates to a light receiving element that receives light from an object and an electronic device using the light receiving element.

BACKGROUND ART

Conventionally, a distance measuring device that measures a distance to an object by measuring a time during which light irradiated to the object while irradiating the object with light reciprocates between the object and the distance measuring device is used. Such a distance measuring method is called a time of flight (ToF) method, and a direct ToF method and an indirect ToF method are used. Among them, the direct ToF method is a method of directly clocking the time during which light reciprocates with an object. This direct ToF method is a method used for measuring the distance to a relatively distant object.

On the other hand, the indirect ToF method is a method of indirectly clocking the time during which light reciprocates with an object, and is a method applied to measurement of a relatively short distance. In the indirect ToF method, light is emitted in a pulse shape of a constant frequency, reflected light from an object is received, and modulation is performed with a signal of the same frequency as that at the time of emission. This modulation is performed with a plurality of phase differences to mutually calculate a plurality of modulated signals. By this calculation, it is possible to measure the phase difference between the emitted light and the reflected light corresponding to the time during which the light reciprocates with the object. This modulation of the reflected light can be performed by a light receiving element including a pixel having a photoelectric conversion unit that converts light into an electric signal. Specifically, two photoelectric conversion units are arranged for each pixel, and modulation is performed by distributing reflected light to two photoelectric conversion units by a rectangular wave modulation signal and performing photoelectric conversion. The image signal generated by each of the distributed photoelectric conversion units is a signal whose pulse width changes according to the phase difference of the reflected light with respect to the emitted light. By performing a plurality of modulations in different phases and acquiring each modulated image signal, the time for light to reciprocate with the object is clocked.

As a light receiving element that performs such distance measurement by the indirect ToF method, a light receiving element including a first voltage application unit and a second voltage application unit and a first charge detection unit and a second charge detection unit on the front surface side of a semiconductor substrate that performs photoelectric conversion has been proposed (see, for example, Patent Document 1). The first charge detection unit is arranged around the first voltage application unit, and the second charge detection unit is arranged around the second voltage application unit. Reflected light from the object is irradiated to the back surface side of the semiconductor substrate, and charges are generated by photoelectric conversion. The generated charges are detected by the first and second charge detection units. At the time of this detection, signals of different voltages are applied to the first and second voltage application units, thereby forming an electric field between the first and second voltage application units. By the formed charges, charges generated by photoelectric conversion are distributed to the first charge detection unit and the second charge detection unit.

CITATION LIST

Patent Document

Patent Document 1: Japanese Patent Application Laid-Open No. 2018-117117 A

SUMMARY OF THE INVENTION

Problems to be Solved by the Invention

In the above-described conventional technique, there is a problem that the sensitivity of distance measurement is low. Each of the first voltage application unit and the second voltage application unit is configured in a circular shape or a rectangular shape, and is formed in a relatively narrow region on the surface on the front side of the pixel. For this reason, there is a problem that an electric field having sufficient intensity cannot be formed in the semiconductor substrate, and transfer efficiency of charges generated by photoelectric conversion to the first and second charge detection units is reduced. For this reason, there is a problem that the sensitivity of distance measurement decreases.

The present disclosure has been made in view of the above-described problems, and an object of the present disclosure is to improve charge transfer efficiency in a semiconductor substrate and to reduce a decrease in sensitivity of distance measurement.

Solutions to Problems

The present disclosure has been made to solve the above-described problems, and a first aspect of the present disclosure is a light receiving element including: a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages; a first charge detection unit that is arranged around the first voltage application unit on a surface of the semiconductor substrate and detects a charge generated by the photoelectric conversion; and a second charge detection unit that is arranged around the second voltage application unit on a surface of the semiconductor substrate and detects a charge generated by the photoelectric conversion.

Furthermore, in the first aspect, the first voltage application unit and the second voltage application unit may include protruding portions as the proximity portions.

Furthermore, in the first aspect, the first voltage application unit and the second voltage application unit may be configured in polygonal line shapes.

Furthermore, in the first aspect, the first voltage application unit and the second voltage application unit may be configured in curved linear shapes.

Furthermore, in the first aspect, the first voltage application unit and the second voltage application unit may be arranged on a surface different from a surface of the semiconductor substrate on which the incident light is incident.

Furthermore, a second aspect of the present disclosure is an electronic device including: a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages; a first charge detection unit that is arranged around the first voltage application unit on a surface of the semiconductor substrate and detects a charge generated by the photoelectric conversion; a second charge detection unit that is arranged around the second voltage application unit on a surface of the semiconductor substrate and detects a charge generated by the photoelectric conversion; and a processing circuit that performs processing on a signal generated on the basis of charges detected by the first charge detection unit and the second charge detection unit.

Furthermore, in the second aspect, the semiconductor substrate may perform photoelectric conversion of reflected light obtained by reflecting light emitted from a light source by an object, and the processing circuit may perform the processing of measuring a distance to the object by clocking a time from emission of light from the light source to incidence of the reflected light.

According to an aspect of the present disclosure, there is an effect that parts of the first voltage application unit and the second voltage application unit configured in linear shapes are close to each other. It is assumed that the electric field intensity near the proximity portions is improved.

MODE FOR CARRYING OUT THE INVENTION

Figure 1:
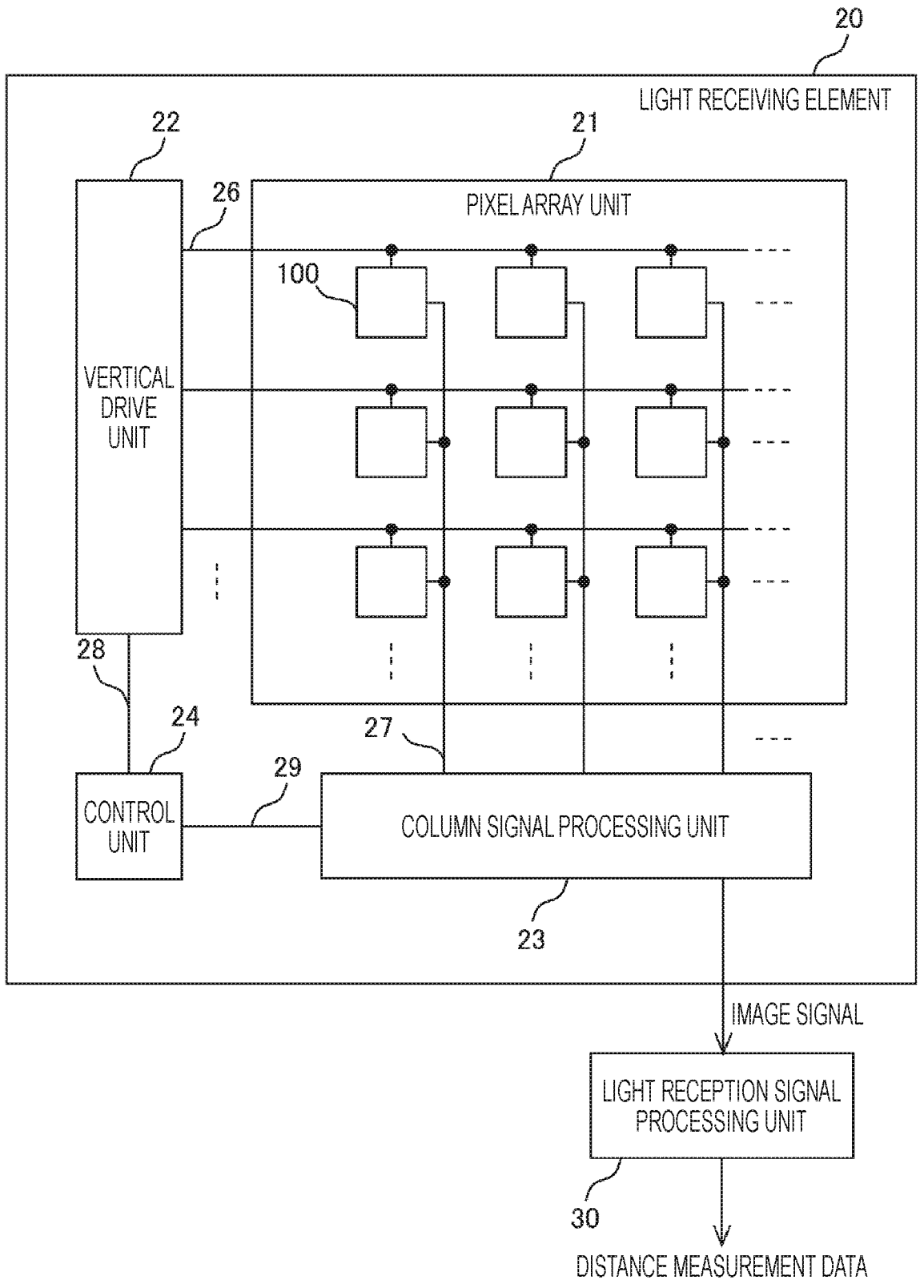
FIG. 1 is a diagram illustrating a configuration example of a light receiving element according to an embodiment of the present disclosure.

Next, modes for carrying out the present disclosure (hereinafter, referred to as embodiments) will be described with reference to the drawings. In the following drawings, the same or similar parts are denoted by the same or similar reference numerals. Furthermore, the embodiments will be described in the following order.

1. First Embodiment
2. Second Embodiment
3. Third Embodiment
4. Application Example to Distance Measuring Device 1. First Embodiment

[Configuration of Light Receiving Element]

FIG. 1 is a diagram illustrating a configuration example of a light receiving element according to an embodiment of the present disclosure. A light receiving element 20 in the drawing includes a pixel array unit 21, a vertical drive unit 22, a column signal processing unit 23, and a control unit 24. Note that, in addition to the light receiving element 20, a light reception signal processing unit 30 is illustrated in the drawing.

The pixel array unit 21 is configured by arranging the pixels 100 in a two-dimensional lattice pattern. Here, the pixel 100 generates an image signal corresponding to the light irradiated. The pixel 100 includes a photoelectric conversion unit that generates a charge according to the light irradiated. Furthermore, the pixel 100 further includes a pixel circuit. The pixel circuit generates an image signal based on the charge generated by the photoelectric conversion unit. Generation of the image signal is controlled by a control signal generated by the vertical drive unit 22 described later. In the pixel array unit 21, signal lines 26 and 27 are arranged in an XY matrix. The signal line 26 is a signal line that transmits a control signal of the pixel circuit in the pixel 100, is arranged for each row of the pixel array unit 21, and is commonly wired to the pixels 100 arranged in each row. The signal line 27 is a signal line that transmits an image signal generated by the pixel circuit of the pixel 100, is arranged for each column of the pixel array unit 21, and is commonly wired to the pixels 100 arranged in each column. The photoelectric conversion unit and the pixel circuit are formed on a semiconductor substrate (semiconductor substrate 120 described later).

The vertical drive unit 22 generates a control signal of a pixel circuit of the pixel 100. The vertical drive unit 22 transmits the generated control signal to the pixel 100 via the signal line 26 in the drawing. The column signal processing unit 23 processes the image signal generated by the pixel 100. The column signal processing unit 23 processes the image signal transmitted from the pixel 100 via the signal line 27 in the drawing. The processing in the column signal processing unit 23 corresponds to, for example, analog-to-digital conversion for converting an analog image signal generated in the pixel 100 into a digital image signal. The image signal processed by the column signal processing unit 23 is output as an image signal of the light receiving element 20. The control unit 24 controls the entire light receiving element 20. The control unit 24 controls the light receiving element 20 by generating and outputting a control signal for controlling the vertical drive unit 22 and the column signal processing unit 23. The control signal generated by the control unit 24 is transmitted to the vertical drive unit 22 and the column signal processing unit 23 by signal lines 28 and 24, respectively.

In the pixel 100 in the drawing, a photoelectric conversion unit including two charge detection units that detect charges generated by photoelectric conversion is arranged. Charges generated by photoelectric conversion are alternately detected by the two charge detection units, and two image signals are generated by a pixel circuit arranged for each charge detection unit. Therefore, the reflected light is modulated. The two image signals generated in the pixel 100 are transmitted to the column signal processing unit 23, converted into digital image signals, and output to the light reception signal processing unit 30. The light reception signal processing unit 30 performs a distance measuring process which is a process of measuring a distance to an object on the basis of an image signal generated by the light receiving element 20. The light receiving element 20 and the light reception signal processing unit 30 are arranged in the distance measuring sensor 2 described later.

[Configuration of Pixel]

Figure 2:
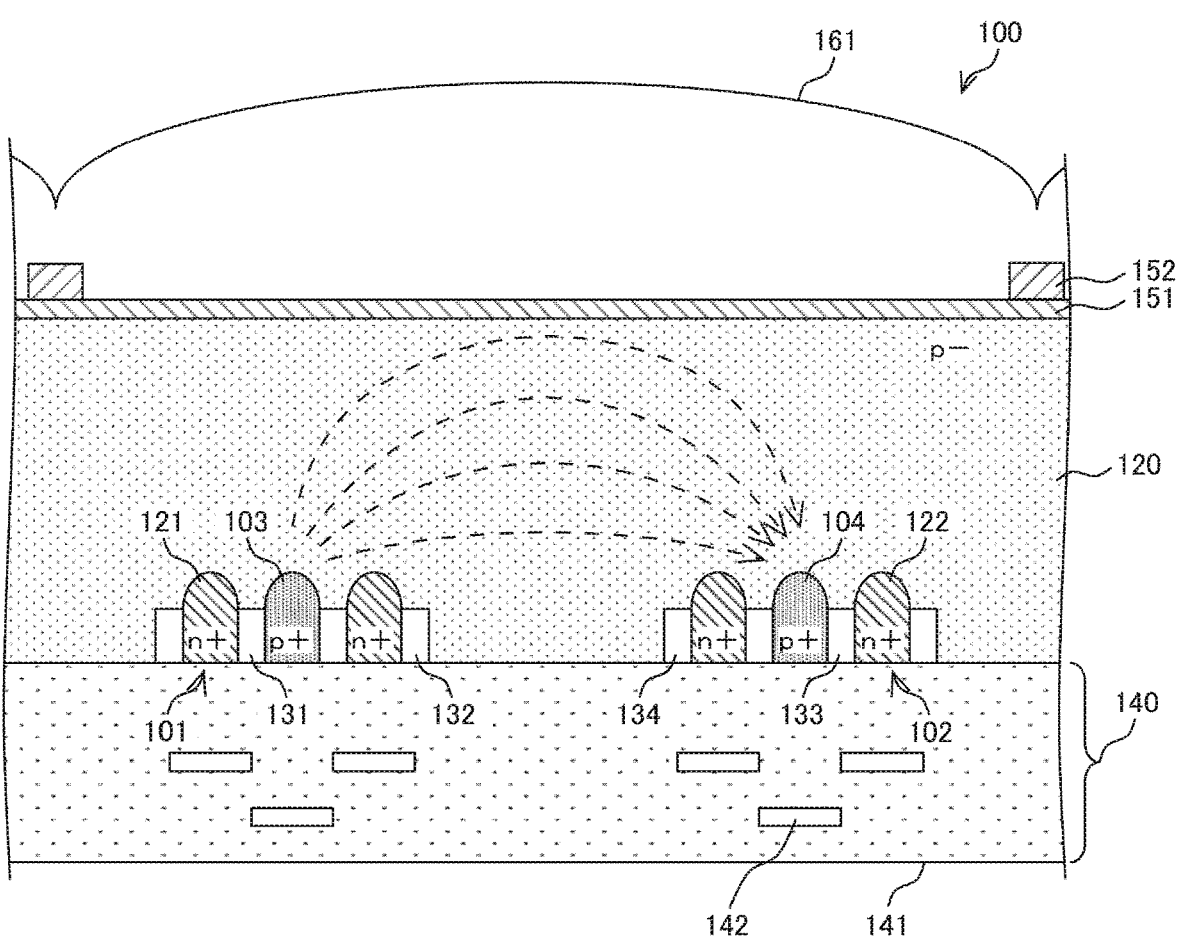
FIG. 2 is a cross-sectional view illustrating a configuration example of a pixel according to the embodiment of the present disclosure.

FIG. 2 is a cross-sectional view illustrating a configuration example of a pixel according to the embodiment of the present disclosure. The drawing is a cross-sectional view illustrating a configuration example of the pixel 100. The pixel 100 includes a semiconductor substrate 120, a wiring region 140, a protective film 151, a light shielding portion 152, and an on-chip lens 161.

The semiconductor substrate 120 is a semiconductor substrate on which a diffusion region of a semiconductor element such as the pixel 100 is formed. As the semiconductor substrate 120, for example, a substrate of silicon (Si) can be used. The semiconductor element such as the pixel 100 is arranged in a well region formed in the semiconductor substrate 120. For convenience, the semiconductor substrate 120 in the drawing is assumed to constitute a p-type well region. By arranging an n-type semiconductor region in the p-type well region, an element such as a photoelectric conversion unit can be configured. In the drawing, the photoelectric conversion units 101 and 102 are illustrated as an example.

The photoelectric conversion unit 101 is constituted by a first charge detection unit 121 and a well region. The first charge detection unit 121 is configured in an n-type semiconductor region, and forms a pn junction with a p-type well region. The photodiode constituted by the pn junction corresponds to the photoelectric conversion unit 101. Furthermore, the photoelectric conversion unit 102 is constituted by a second charge detection unit 122 and a well region. The second charge detection unit 122 is configured in an n-type semiconductor region, and forms a pn junction with a p-type well region to configure a photodiode. This photodiode represents the photoelectric conversion unit 102. In this manner, the photoelectric conversion units 101 and 102 are photodiodes having the well region as a common anode region and the two n-type semiconductor regions as individual cathode regions.

The first charge detection unit 121 and the second charge detection unit 122 detect charges generated by photoelectric conversion. In the pixel 100 in the drawing, incident light is irradiated to a p-type well region from the back surface side of the semiconductor substrate 120, and is photoelectrically converted. Among the charges generated by the photoelectric conversion, electrons move to and are accumulated in the first charge detection unit 121 and the second charge detection unit 122 configured in the n-type semiconductor region. The accumulated charges are transferred to a pixel circuit (not illustrated), and an image signal is generated. In this manner, charges are detected by the first charge detection unit 121 and the second charge detection unit 122. Note that the first charge detection unit 121 and the second charge detection unit 122 can be configured to have a relatively high impurity concentration. This is for obtaining ohmic contact when wiring lines described later are connected.

A first voltage application unit 103 and a second voltage application unit 104 apply different voltages to the semiconductor substrate 120. The first voltage application unit 103 and the second voltage application unit 104 can be constituted by, for example, a semiconductor region of the same conductivity type as the semiconductor substrate 120. An example in which the first voltage application unit 103 and the second voltage application unit 104 in the drawing are configured in a p-type semiconductor region having a relatively high impurity concentration is illustrated. Furthermore, the first voltage application unit 103 and the second voltage application unit 104 are arranged in the vicinity of the first charge detection unit 121 and the second charge detection unit 122, respectively. The drawing illustrates an example in which the first voltage application unit 103 and the second voltage application unit 104 are provided in the first charge detection unit 121 and the second charge detection unit 122, respectively, on the front surface side of the semiconductor substrate 120. That is, the drawing illustrates an example in which the first charge detection unit 121 is arranged around the first voltage application unit 103 and the second charge detection unit 122 is arranged around the second voltage application unit 104.

In the pixel 100 having such a configuration, when different voltages are applied to the first voltage application unit 103 and the second voltage application unit 104, a potential gradient and an electric field are formed in the semiconductor substrate 120. Dotted arrows in the drawing represent electric fields (lines of electric force) in a case where a voltage higher than that of the second voltage application unit 104 is applied to the first voltage application unit 103. The electric charge of the semiconductor substrate 120 moves along this electric field. The first voltage application unit 103 and the second voltage application unit 104 are arranged in the vicinity of the first charge detection unit 121 and the second charge detection unit 122, respectively. Moreover, different voltages are applied to the first voltage application unit 103 and the second voltage application unit 104 to form an electric field and a potential gradient. Therefore, the charge generated by the photoelectric conversion can be guided to either the first charge detection unit 121 or the second charge detection unit 122. It is possible to distribute detection of charges to the first charge detection unit 121 and the second charge detection unit 122.

As illustrated in the drawing, in a case where a higher voltage is applied to the first voltage application unit 103, electrons generated by photoelectric conversion move to the vicinity of the first voltage application unit 103, reach the first charge detection unit 121, and are detected. On the other hand, in a case where a higher voltage is applied to the second voltage application unit 104, electrons generated by photoelectric conversion move to the vicinity of the second voltage application unit 104, reach the second charge detection unit 122, and are detected.

On the surface of the front side of the semiconductor substrate 120 at the boundary between the first voltage application unit 103 and the second voltage application unit 104 and the first charge detection unit 121 and the second charge detection unit 122, separation portions that separate these regions are arranged. A separation portion 131 is arranged between the first voltage application unit 103 and the first charge detection unit 121, and a separation portion 133 is arranged between the second voltage application unit 104 and the second charge detection unit 122. Furthermore, a separation portion 132 and a separation portion 134 are arranged between the first charge detection unit 121 and the well region and between the second charge detection unit 122 and the well region, respectively. The separation portions 131 to 134 can be constituted by an insulator. For example, the separation portions 131 to 134 can be constituted by silicon oxide (SiO₂). The separation portions 131 to 134 in the drawing illustrates examples configured as shallow trench isolation (STI).

The wiring region 140 is a region where wiring such as elements of the pixel 100 is formed. The wiring region 140 is arranged on the front surface side of the semiconductor substrate 120. The wiring region 140 includes a wiring layer 142 and an insulating layer 141. The wiring layer 142 transmits an electric signal to the semiconductor element of the pixel 100. The wiring layer 142 can be constituted by metal such as copper (Cu). The insulating layer 141 insulates the wiring layer 142. The insulating layer 141 can be constituted by, for example, SiO₂ or silicon nitride (SiN). The wiring layer 142 and the insulating layer 141 can be configured in multiple layers. The wiring layer 142 and the semiconductor region of the semiconductor substrate 120 can be connected by a contact plug (not illustrated). The contact plug is constituted by a columnar metal, and electrically connects the wiring layer 142 and the semiconductor region.

The protective film 151 protects the back surface side of the semiconductor substrate 120. The protective film 151 can be constituted by, for example, SiO₂.

The light shielding portion 152 shields incident light. The light shielding portion 152 is arranged on the back surface side of the semiconductor substrate 120 at the boundary of the pixel 100, and shields incident light obliquely incident from the adjacent pixel 100. The light shielding portion 152 can be constituted by, for example, tungsten (W).

The on-chip lens 161 is a lens that is configured in a hemispherical shape and condenses incident light.

The on-chip lens 161 is arranged on the back surface side of the semiconductor substrate 120 and condenses incident light on a region of the semiconductor substrate 120 where photoelectric conversion is performed. The on-chip lens 161 in the drawing illustrates an example of condensing light on the semiconductor substrate 120 between the first charge detection unit 121 and the second charge detection unit 122. The on-chip lens 161 can be constituted by an inorganic material such as SiN or an organic material such as an acrylic resin. Note that the region below the on-chip lens 161 functions as a film that planarizes and protects the back surface side of the semiconductor substrate 120 on which the light shielding portion 152 and the like are arranged.

[Configuration of Plane of Pixel]

Figure 3:
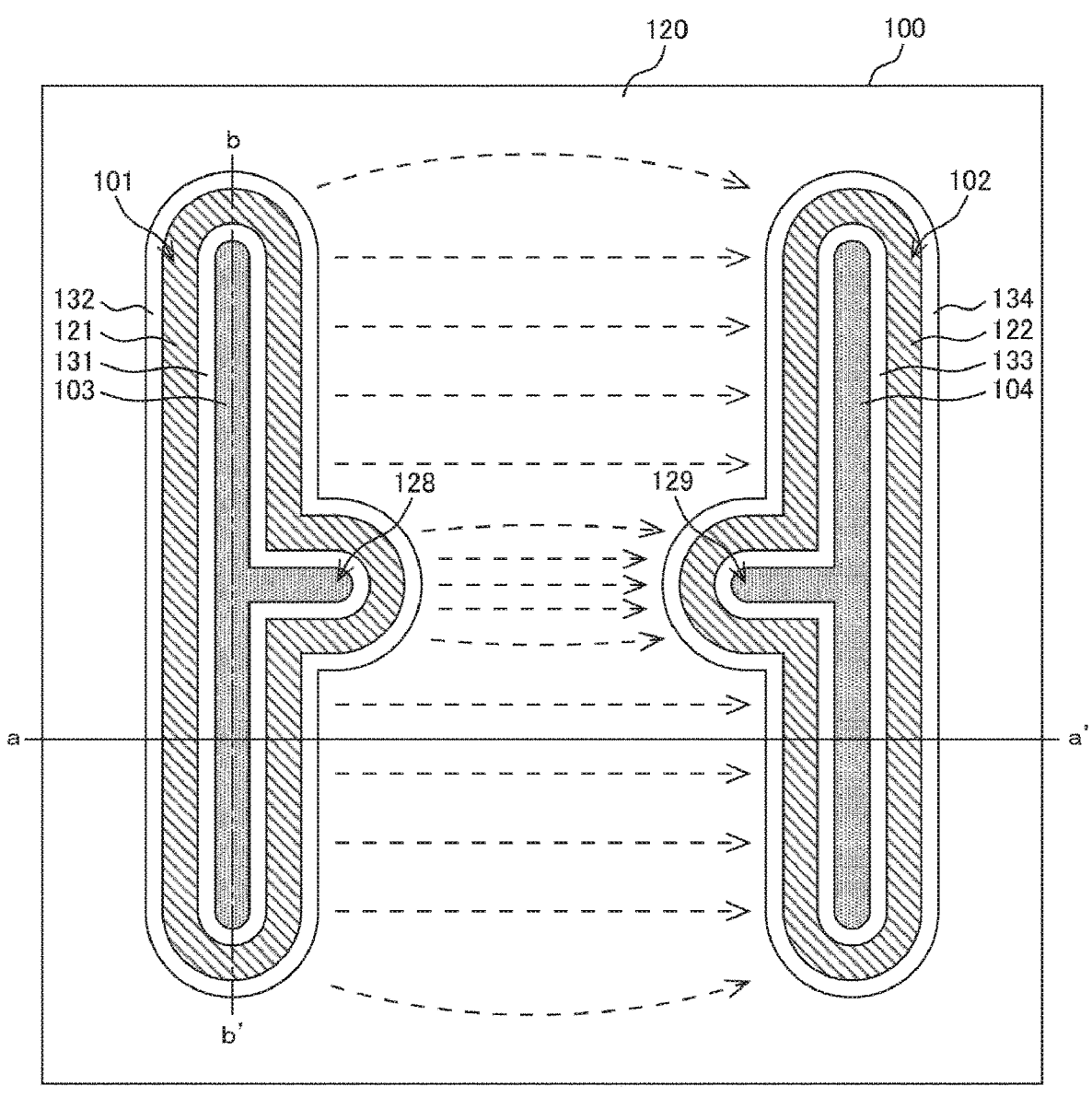
FIG. 3 is a plan view illustrating a configuration example of a pixel according to a first embodiment of the present disclosure.

FIG. 3 is a plan view illustrating a configuration example of a pixel according to the first embodiment of the present disclosure. The drawing is a plan view illustrating a configuration example of the pixel 100, and is a plan view illustrating a configuration on the front surface side of the semiconductor substrate 120. Note that FIG. 2 is a cross-sectional view taken along line a-a' in the drawing. The first voltage application unit 103 is configured in a linear shape, and the first charge detection unit 121 is arranged around the first voltage application unit 103. The separation portion 131 is arranged between the first voltage application unit 103 and the first charge detection unit 121, and the separation portion 132 is arranged around the first charge detection unit 121. Similarly, the second voltage application unit 104 is also configured in a linear shape, and the second charge detection unit 122 is arranged around the second voltage application unit 104. The separation portion 133 is arranged between the second voltage application unit 104 and the second charge detection unit 122, and the separation portion 134 is arranged around the second charge detection unit 122.

As illustrated in the drawing, the first voltage application unit 103 and the second voltage application unit 104 are configured in linear shapes extending in the same direction and are arranged apart from each other. By configuring the first voltage application unit 103 and the second voltage application unit 104 in linear shapes, the occupied area of the first voltage application unit 103 and the second voltage application unit 104 can be reduced. As described above, when different voltages are applied to the first voltage application unit 103 and the second voltage application unit 104, holes are injected from the regions, and the holes move in the p-type well region according to the potential difference. That is, a current flows. When the regions of the first voltage application unit 103 and the second voltage application unit 104 are expanded, the current increases and the power consumption increases. By configuring the first voltage application unit 103 and the second voltage application unit 104 in linear shapes to reduce the surface area, an increase in current can be reduced, and an increase in power consumption can be reduced.

Furthermore, by extending the first voltage application unit 103 and the second voltage application unit 104 to the vicinity of the end portions of the pixel 100, a homogeneous electric field can be formed in a wide range of the pixel 100, and the moving distance of the charge in the vicinity of the end portions of the pixel 100 can be shortened. This enables high-speed charge detection.

Proximity portions 128 and 129 are arranged in the first voltage application unit 103 and the second voltage application unit 104 in the drawing, respectively. The proximity portions 128 and 129 in the drawing illustrate an example constituted by protruding portions respectively arranged at the central portions of the first voltage application unit 103 and the second voltage application unit 104 having linear shapes. By arranging these proximity portions 128 and 129, the distance between the first voltage application unit 103 and the second voltage application unit 104 can be shortened in the region. Therefore, a relatively high electric field can be formed in the vicinity of the proximity portions 128 and 129. Dotted arrows in the drawing represent lines of electric force similarly to FIG. 2. These illustrate a state in which the density of lines of electric force increases in the vicinity of the proximity portions 128 and 129 and a high electric field is formed.

By forming a region of a relatively high electric field between the first voltage application unit 103 and the second voltage application unit 104, the moving speed of the charge generated by photoelectric conversion can be improved, and the charge transfer efficiency can be improved. Furthermore, in the first voltage application unit 103 and the second voltage application unit 104 in the drawing, the proximity portions 128 and 129 are arranged in the vicinity of the central portion of the pixel 100. The region is a region where incident light is condensed by the on-chip lens 161, and is a region where a large amount of charge is generated. By forming the high electric field region in this region, the charge transfer efficiency can be further improved.

In this manner, the first voltage application unit 103 and the second voltage application unit 104 are configured in linear shapes, and the proximity portions 128 and 129 are arranged. Therefore, the moving distance of the charge can be shortened in a wide range of the semiconductor substrate 120, and the moving speed of the charge can be increased in a partial region. It is possible to improve charge transfer efficiency while reducing an increase in power consumption.

Note that the first voltage application unit 103 and the second voltage application unit 104 in the drawing can also be regarded as regions configured in asymmetric shapes. For example, the first voltage application unit 103 has a symmetrical shape in the vertical direction in the drawing, but is configured in an asymmetrical shape in the horizontal direction. In the drawing, b-b' represents a center line of a portion configured in a linear shape of the first voltage application unit 103. The first voltage application unit 103 can be regarded as a shape in which an asymmetric portion is added in a direction toward the second voltage application unit 104 with respect to the center line. By adding this asymmetric portion, the electric field intensity of the first voltage application unit 103 and the second voltage application unit 104 can be partially increased.

Figure 4A:
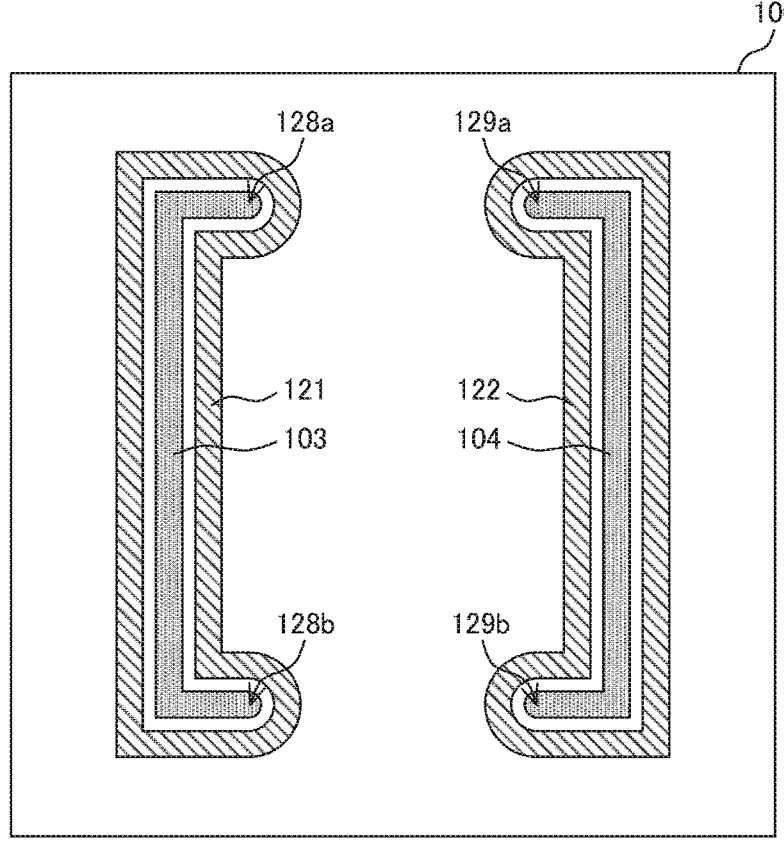
FIGS. 4A and 4B are plan views illustrating another configuration example of the pixel according to the first embodiment of the present disclosure.
Figure 4B:
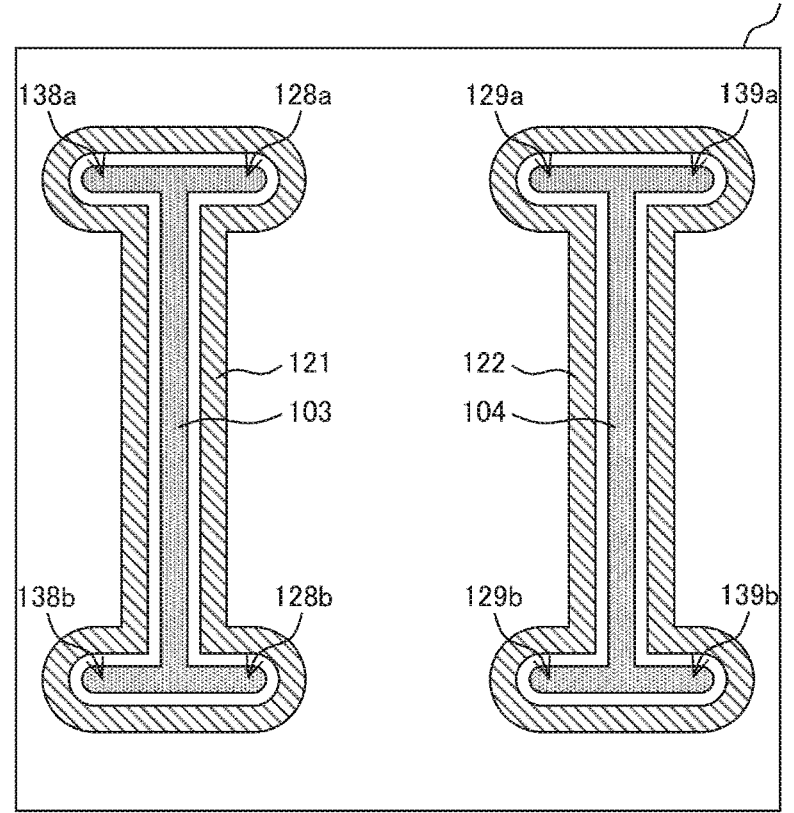

[Another Configuration of Plane of Pixel] FIGS. 4A and 4B are plan views illustrating another configuration example of the pixel according to the first embodiment of the present disclosure. The drawing is a plan view illustrating a configuration example of the pixel 100 similarly to FIG. 3. The pixel 100 is different from the pixel 100 in FIG. 3 in that proximity portions are arranged at end portions of each of the first voltage application unit 103 and the second voltage application unit 104. Note that, in the following drawings, reference numerals of the photoelectric conversion units 101 and 102 and the separation portions 131 to 134 are omitted.

FIG. 4A illustrates an example in which the proximity portions 128 and 129 of the first voltage application unit 103 and the second voltage application unit 104 are arranged in the vicinity of the end portions of the pixel 100. The first voltage application unit 103 in FIG. 4A includes proximity portions 128a and 128b. Furthermore, the second voltage application unit 104 in FIG. 4A includes proximity portions 129a and 129b. The proximity portion 128a and the proximity portion 129a are arranged at positions facing each other. Similarly, the proximity portion 128b and the proximity portion 129b are also arranged at positions facing each other. By arranging the proximity portions 128a and 128b and the proximity portions 129a and 129b, the electric field of the semiconductor substrate 120 in the vicinity of the end portions of the pixel 100 can be increased. The charge transfer efficiency of the region can be improved.

FIG. 4B illustrates an example in which the protruding portions 138 and 139 are further arranged. The first voltage application unit 103 in FIG. 4B further includes a protruding portion 138a and a protruding portion 138b. The protruding portions 138a and 138b protrude in a direction different from the direction toward the second voltage application unit 104. Furthermore, the second voltage application unit 104 in FIG. 4B further includes a protruding portion 139a and a protruding portion 139b. The protruding portions 139a and 139b also protrude in a direction different from the direction toward the first voltage application unit 103. By arranging such protruding portions 138 and 139, it is possible to expand a region in which a relatively high electric field is applied to corner portions or the like of the pixel 100. The charge transfer efficiency of the region can be improved.

As described above, in the light receiving element 20 of the first embodiment of the present disclosure, the first voltage application unit 103 and the second voltage application unit 104 are configured in linear shapes, and the proximity portions 128 and 129 are added. Therefore, it possible to improve the charge transfer efficiency generated by photoelectric conversion while preventing an increase in power consumption. The sensitivity of distance measurement can be improved.

2. Second Embodiment

The light receiving element 20 of the first embodiment described above includes the first voltage application unit 103 and the second voltage application unit 104 configured in linear shapes having the protruding portions. On the other hand, a light receiving element 20 of a second embodiment of the present disclosure is different from that of the first embodiment described above in that the light receiving element 20 of the second embodiment includes a first voltage application unit 103 and a second voltage application unit 104 configured in polygonal line shapes.

Figure 5A:
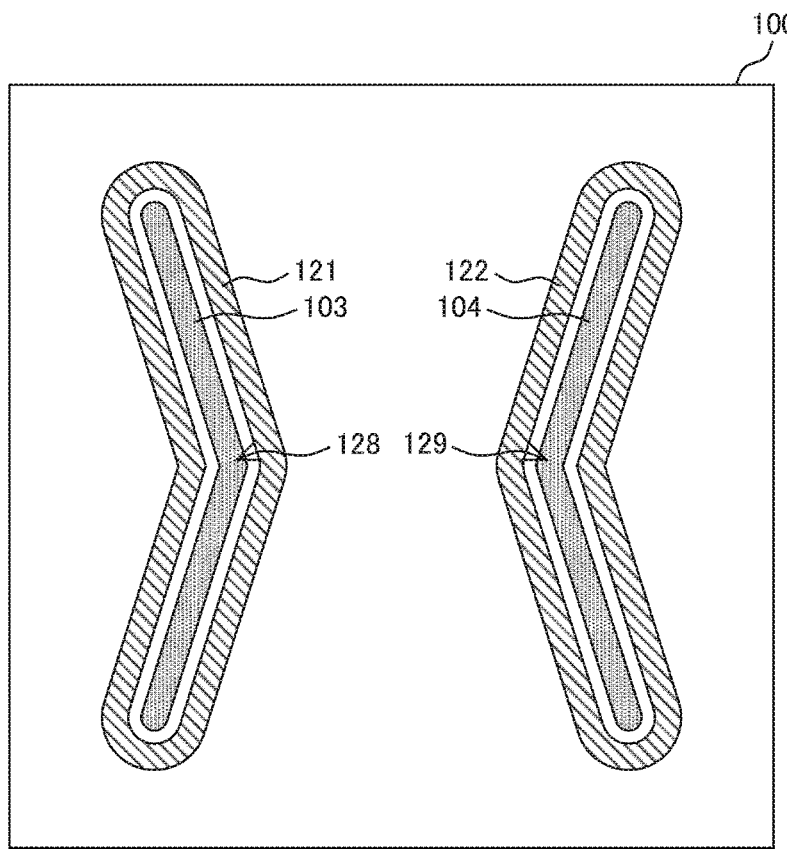
FIGS. 5A and 5B are plan views illustrating a configuration example of a pixel according to a second embodiment of the present disclosure.
Figure 5B:
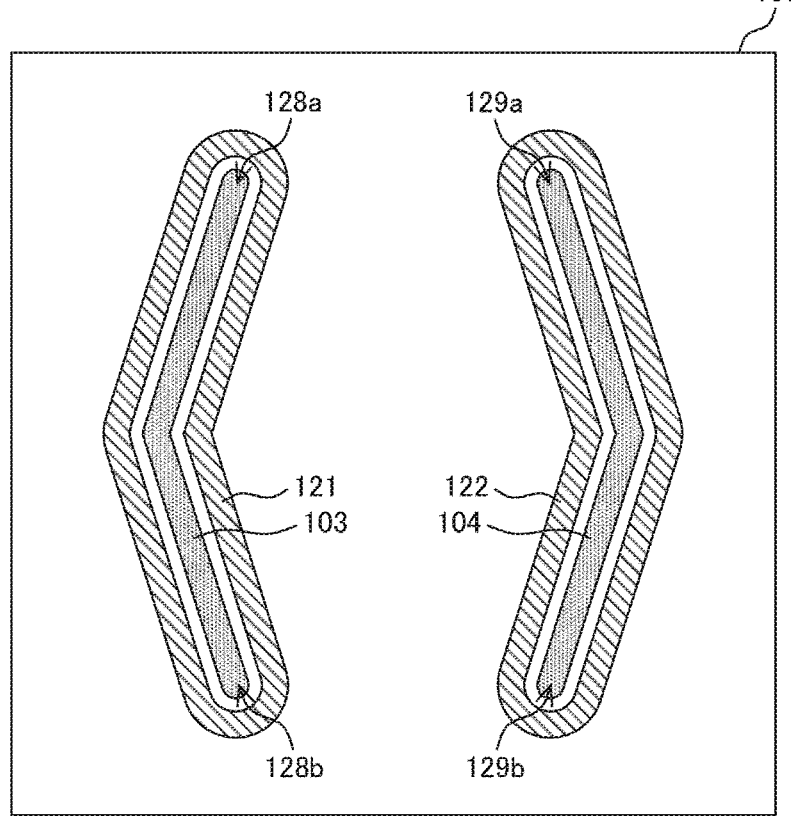

[Configuration of Plane of Pixel] FIGS. 5A and 5B are plan views illustrating a configuration example of a pixel according to the second embodiment of the present disclosure. The drawing is a plan view illustrating a configuration example of the pixel 100 similarly to FIG. 3. The pixel 100 is different from the pixel 100 described with reference to FIG. 3 in that the first voltage application unit 103 and the second voltage application unit 104 having polygonal line shapes are provided.

The first voltage application unit 103 and the second voltage application unit 104 in the drawing are configured in polygonal line shapes having folded portions at the central portion. FIG. 5A illustrates an example in which the first voltage application unit 103 and the second voltage application unit 104 are arranged in directions in which the bent portions approach each other. In the first voltage application unit 103 and the second voltage application unit 104 in FIG. 5A, the bent portions constitute the proximity portions 128 and 129, respectively.

On the other hand, the first voltage application unit 103 and the second voltage application unit 104 in FIG. 5B are arranged in directions in which the bent portions are apart from each other. The end portions of the first voltage application unit 103 and the second voltage application unit 104 in FIG. 5B constitute the proximity portions 128 and 129, respectively. In the first voltage application unit 103 in FIG. 5B, two end portions constitute the proximity portions 128a and 128b. Similarly, in the second voltage application unit 104 in FIG. 5B, two end portions constitute the proximity portions 129a and 129b.

In this manner, the first voltage application unit 103 and the second voltage application unit 104 in the drawing are configured in polygonal line shapes, and the proximity portions 128 and 129 are arranged. Therefore, the moving distance of the charge can be shortened in a wide range of the semiconductor substrate 120, and the moving speed of the charge can be increased in a partial region. It is possible to improve charge transfer efficiency while reducing an increase in power consumption.

Figure 6A:
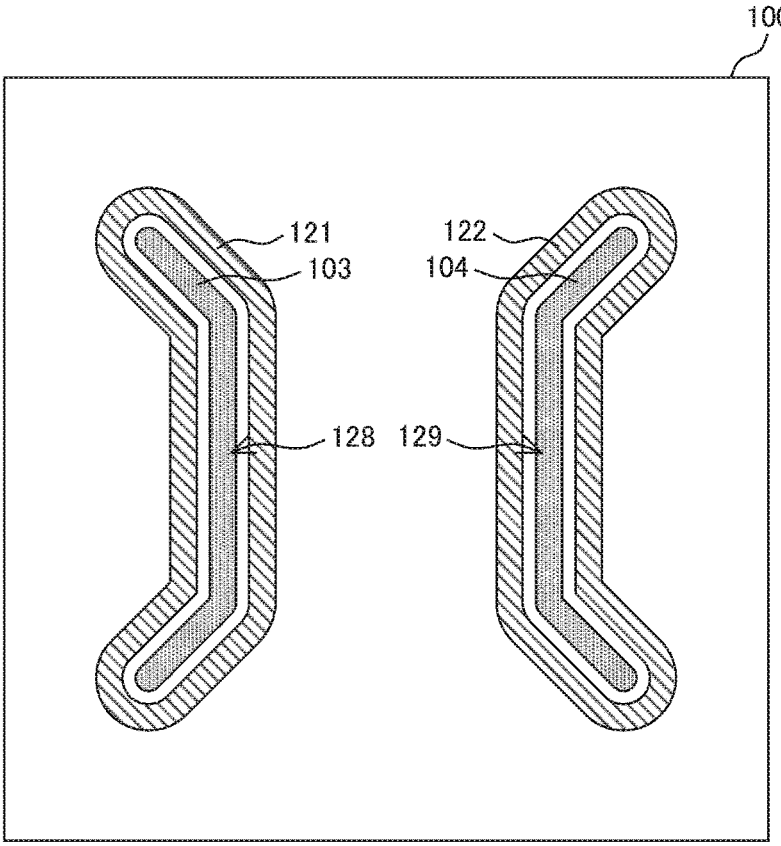
FIGS. 6A and 6B are plan views illustrating another configuration example of the pixel according to the second embodiment of the present disclosure.
Figure 6B:
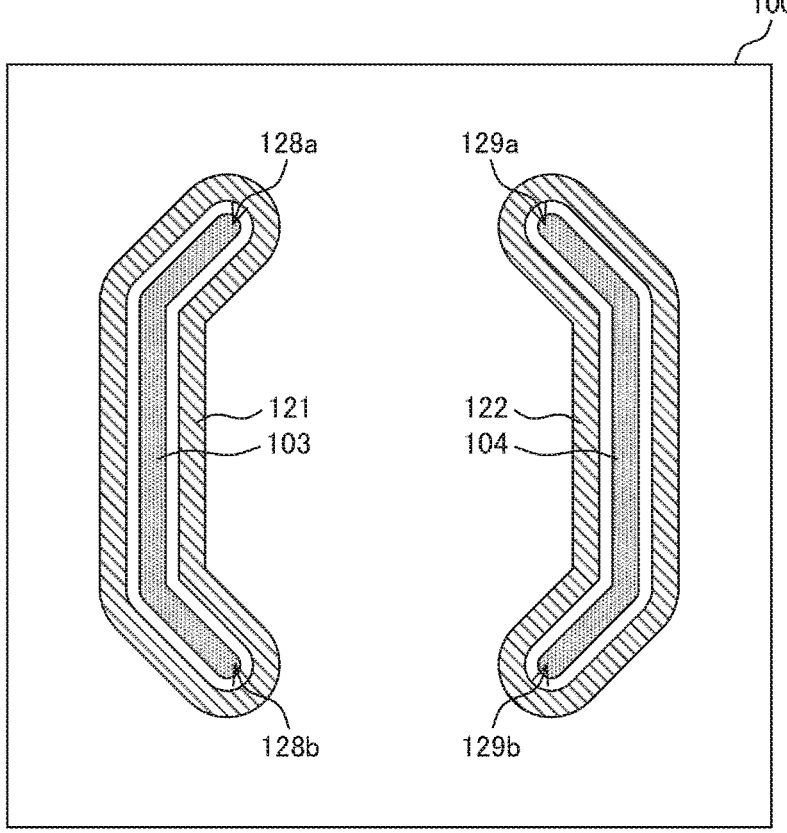

[Another Configuration of Plane of Pixel] FIGS. 6A and 6B are plan views illustrating another configuration example of the pixel according to the second embodiment of the present disclosure. The drawing is a plan view illustrating a configuration example of the pixel 100 similarly to FIGS. 5A and 5B. The pixel 100 is different from the pixel 100 described in FIGS. 5A and 5B in that two bent portions are arranged in the first voltage application unit 103 and the second voltage application unit 104.

In the first voltage application unit 103 and the second voltage application unit 104 in FIG. 6A, each of linear regions between two bent portions constitutes the proximity portions 128 and 129. Furthermore, two end portions of the first voltage application unit 103 in FIG. 6B constitute the proximity portions 128a and 128b, and two end portions of the second voltage application unit 104 in FIG. 6B constitute the proximity portions 129a and 129b.

Figure 7:
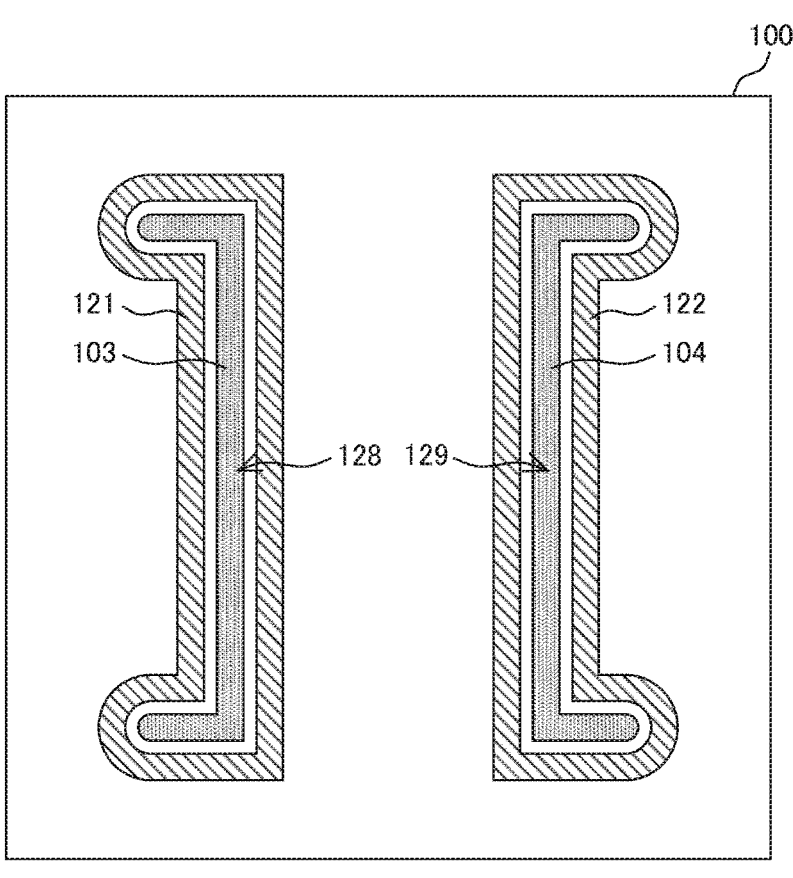
FIG. 7 is a plan view illustrating a modification of the configuration of the pixel according to the second embodiment of the present disclosure.

[Modification] FIG. 7 is a plan view illustrating a modification of the configuration of the pixel according to the second embodiment of the present disclosure. Similarly to the first voltage application unit 103 and the second voltage application unit 104 in A of the drawing, two bent portions are arranged in each of the first voltage application unit 103 and the second voltage application unit 104 in FIGS. 6A and 6B. The first voltage application unit 103 and the second voltage application unit 104 are different from the first voltage application unit 103 and the second voltage application unit 104 in FIG. 6A in that the bent portions are arranged in the vicinity of the end portions of the pixel 100.

Also in the first voltage application unit 103 and the second voltage application unit 104 in the drawing, the proximity portions 128 and 129 are arranged at the central portion.

The configuration of the light receiving element 20 other than this is similar to the configuration of the light receiving element 20 described in the first embodiment of the present disclosure, and thus the description thereof will be omitted.

As described above, in the light receiving element 20 of the second embodiment of the present disclosure, the first voltage application unit 103 and the second voltage application unit 104 are configured in polygonal line shapes, and the proximity portions 128 and 129 are added. Therefore, it possible to improve the charge transfer efficiency generated by photoelectric conversion while preventing an increase in power consumption.

3. Third Embodiment

The light receiving element 20 of the second embodiment described above includes the first voltage application unit 103 and the second voltage application unit 104 configured in polygonal line shapes. On the other hand, the light receiving element 20 of a third embodiment of the present disclosure is different from that of the first embodiment described above in that the light receiving element 20 of the third embodiment includes a first voltage application unit 103 and a second voltage application unit 104 configured in curved linear shapes.

Figure 8A:
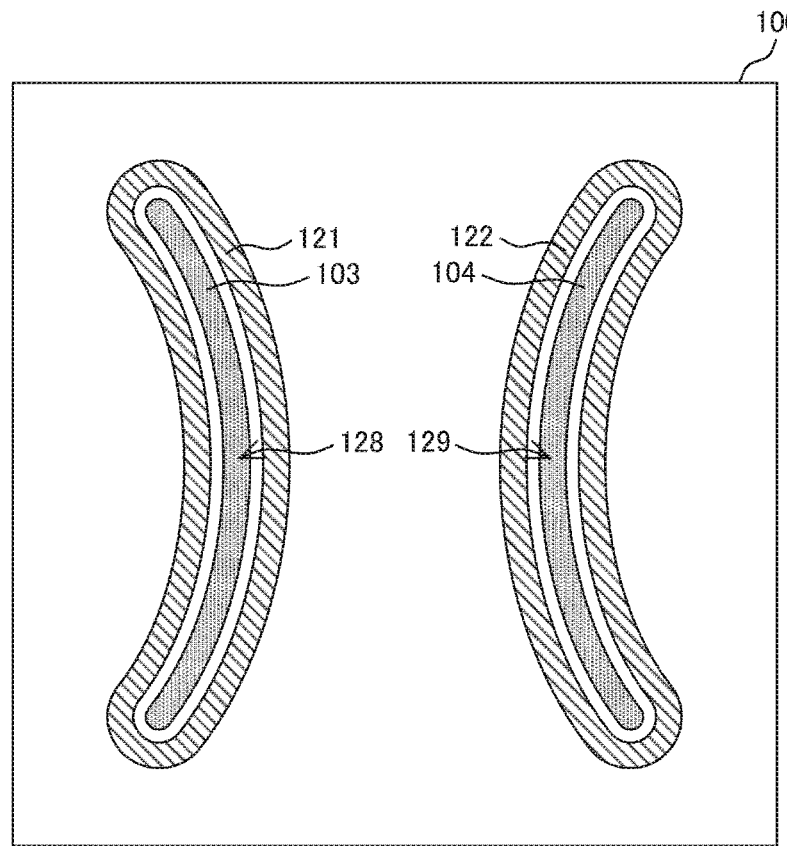
FIGS. 8A and 8B are diagrams illustrating a configuration example of a pixel according to a third embodiment of the present disclosure.
Figure 8B:
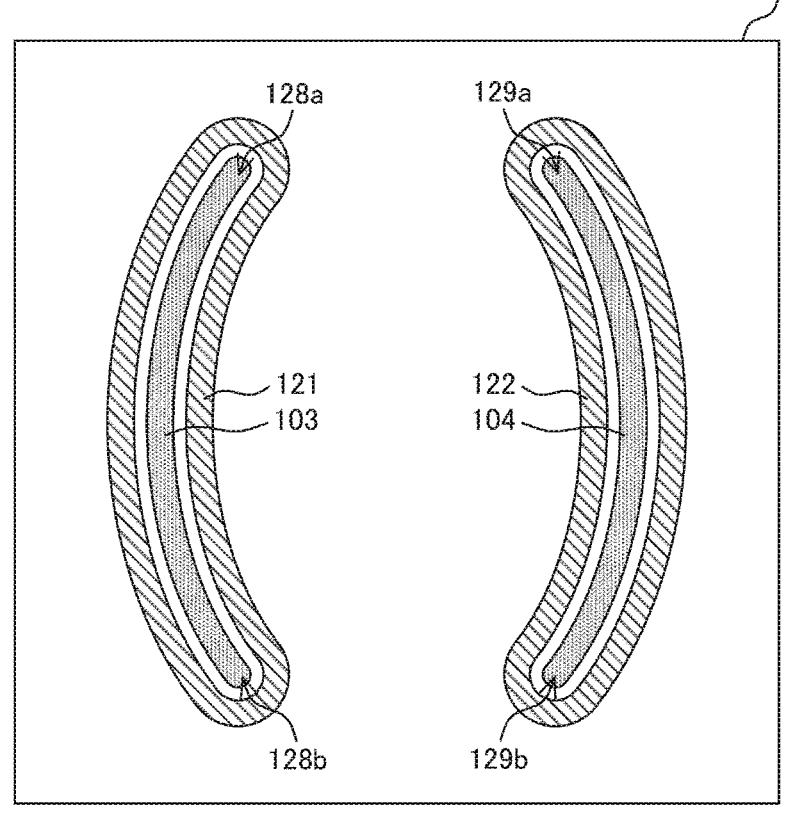

[Configuration of Pixel] FIGS. 8A and 8B are diagrams illustrating a configuration example of a pixel according to the third embodiment of the present disclosure. The drawing is a plan view illustrating a configuration example of the pixel 100 similarly to FIGS. 5A and 5B. The pixel 100 is different from the pixel 100 described in FIGS. 5A and 5B in that the first voltage application unit 103 and the second voltage application unit 104 having curved linear shapes are provided.

The first voltage application unit 103 and the second voltage application unit 104 in the drawing are configured in curved linear shapes from central portions to end portions. FIG. 8A illustrates an example in which the first voltage application unit 103 and the second voltage application unit 104 are arranged in directions in which the central portions are close to each other. The central portions of the first voltage application unit 103 and the second voltage application unit 104 in FIG. 8A constitute the proximity portions 128 and 129, respectively.

On the other hand, the first voltage application unit 103 and the second voltage application unit 104 in FIG. 8B are arranged in directions in which the central portions are apart from each other. The end portions of the first voltage application unit 103 and the second voltage application unit 104 in FIG. 8B constitute the proximity portions 128 and 129, respectively. In the first voltage application unit 103 in FIG. 8B, two end portions constitute the proximity portions 128a and 128b. Similarly, in the second voltage application unit 104 in FIG. 8B, two end portions constitute the proximity portions 129a and 129b.

In this manner, the first voltage application unit 103 and the second voltage application unit 104 in the drawing are configured in curved linear shapes, and the proximity portions 128 and 129 are arranged. Therefore, the moving distance of the charge can be shortened in a wide range of the semiconductor substrate 120, and the moving speed of the charge can be increased in a partial region. It is possible to improve charge transfer efficiency while reducing an increase in power consumption.

The configuration of the light receiving element 20 other than this is similar to the configuration of the light receiving element 20 described in the second embodiment of the present disclosure, and thus the description thereof will be omitted.

As described above, in the light receiving element 20 of the third embodiment of the present disclosure, the first voltage application unit 103 and the second voltage application unit 104 are configured in curved linear shapes, and the proximity portions 128 and 129 are added. Therefore, it possible to improve the charge transfer efficiency generated by photoelectric conversion while preventing an increase in power consumption.

Note that the configuration of the pixel 100 of the first embodiment can be combined with other embodiments. Specifically, the protruding portions constituting the proximity portions 128 and 129 in FIG. 3 can be applied to the first voltage application unit 103 and the second voltage application unit 104 in FIGS. 5A, 6A, 7, and 8A.

4. Application Example to Distance Measuring Device

The technology according to the present disclosure can be applied to various products. For example, the technology according to the present disclosure may be applied to a distance measuring device.

[Configuration of Pixel]

Figure 9:
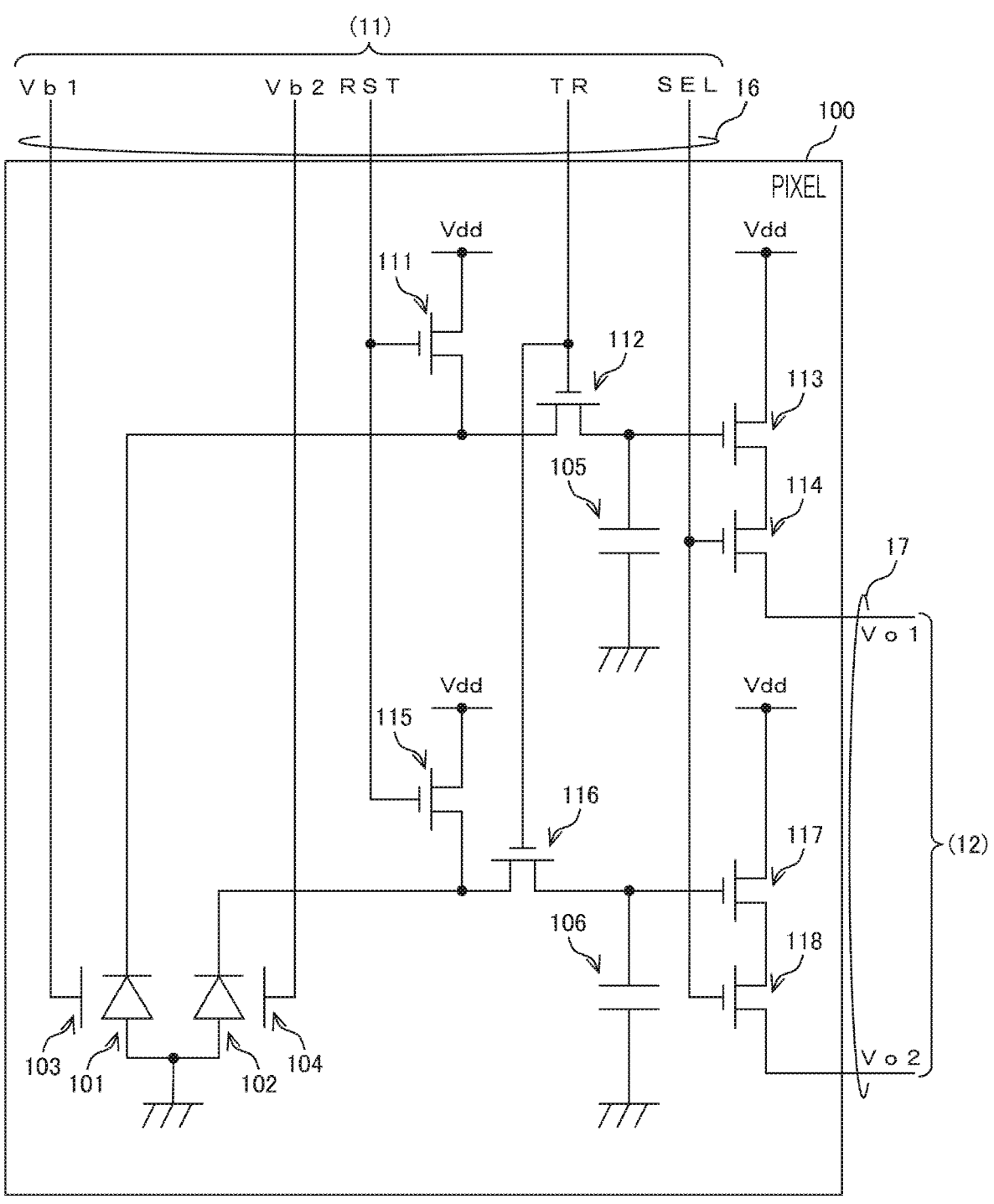
FIG. 9 is a diagram illustrating a configuration example of a pixel according to an embodiment of the present disclosure.

FIG. 9 is a diagram illustrating a configuration example of a pixel according to the embodiment of the present disclosure. The drawing is a circuit diagram illustrating a configuration example of the pixel 100. The pixel 100 in the drawing includes photoelectric conversion units 101 and 102, a first voltage application unit 103 and a second voltage application unit 104, charge holding units 105 and 106, and MOS transistors 111 to 118. As the MOS transistors 111 to 118 in the drawing, n-channel MOS transistors can be used.

The anode of the photoelectric conversion unit 101 is grounded, and the cathode is connected to the source of the MOS transistor 111 and the source of the MOS transistor 112. The drain of the MOS transistor 111 is connected to the power supply line Vdd, and the drain of the MOS transistor 112 is connected to the gate of the MOS transistor 113 and one end of the charge holding unit 105. The other end of the charge holding unit 105 is grounded. The drain of the MOS transistor 113 is connected to the power supply line Vdd, and the source is connected to the drain of the MOS transistor 114. The source of the MOS transistor 114 is connected to the output signal line Vo1.

The anode of the photoelectric conversion unit 102 is grounded, and the cathode is connected to the source of the MOS transistor 115 and the source of the MOS transistor 116. The drain of the MOS transistor 115 is connected to the power supply line Vdd, and the drain of the MOS transistor 116 is connected to the gate of the MOS transistor 117 and one end of the charge holding unit 106. The other end of the charge holding unit 106 is grounded. The drain of the MOS transistor 117 is connected to the power supply line Vdd, and the source is connected to the drain of the MOS transistor 118. The source of the MOS transistor 118 is connected to the output signal line Vo2.

The first voltage application unit 103 and the second voltage application unit 104 are connected to the bias signal line Vb1 and the bias signal line Vb2, respectively. The gate of the MOS transistor 111 and the gate of the MOS transistor 115 are commonly connected to the reset signal line RST. The gate of the MOS transistor 112 and the gate of the MOS transistor 116 are commonly connected to the transfer signal line TR. The gate of the MOS transistor 114 and the gate of the MOS transistor 118 are commonly connected to the selection signal line SEL.

Note that the bias signal line Vb1, the bias signal line Vb2, the reset signal line RST, the transfer signal line TR, and the selection signal line SEL constitute a signal line 11. The output signal line Vo1 and the output signal line Vo2 constitute a signal line 12.

The photoelectric conversion units 101 and 102 generate charges according to the light irradiated as described above, and are constituted by photodiodes. Furthermore, the photoelectric conversion units 101 and 102 have a common anode region.

The first voltage application unit 103 and the second voltage application unit 104 apply voltages to the semiconductor substrates in the vicinity of the photoelectric conversion units 101 and 102. In the first voltage application unit 103 and the second voltage application unit 104 in the drawing, bias voltages of different voltages are applied via the bias signal lines Vb1 and Vb2.

The MOS transistor 112 is a transistor that transfers a charge generated by photoelectric conversion of the photoelectric conversion unit 101 to the charge holding unit 105. Furthermore, the MOS transistor 116 is a transistor that transfers a charge generated by photoelectric conversion of the photoelectric conversion unit 102 to the charge holding unit 106. The transfer of charges in the MOS transistors 112 and 116 is controlled by a signal transmitted by the transfer signal line TR.

The charge holding units 105 and 106 are capacitors that hold the charges transferred by the MOS transistors 112 and

116, respectively. The MOS transistors 113 and 117 are transistors that generate signals based on the charges held in the charge holding units 105 and 106, respectively. The MOS transistor 114 is a transistor that outputs a signal generated by the MOS transistor 113 to the output signal line Vo1 as an image signal. Furthermore, the MOS transistor 118 is a transistor that outputs a signal generated by the MOS transistor 117 to the output signal line Vo2 as an image signal. The MOS transistors 114 and 118 are controlled by a signal transmitted by the selection signal line SEL.

The MOS transistors 111 and 115 are transistors that reset the photoelectric conversion units 101 and 102, respectively. The MOS transistors 111 and 115 are reset by discharging the charges held in the photoelectric conversion units 101 and 102 to the power supply line Vdd. Resetting by the MOS transistors 111 and 115 is controlled by a signal transmitted by the reset signal line RST. Note that, at the time of this reset, the charge holding units 105 and 106 can also be reset by making the MOS transistors 112 and 116 conductive.

Generation of the image signal in the pixel 100 in the drawing can be performed as follows. First, the MOS transistors 112 and 116 are made conductive, and the MOS transistors 111 and 115 are made conductive. Therefore, the photoelectric conversion units 101 and 102 and the charge holding units 105 and 106 are reset. Next, the MOS transistors 112, 116, 111, and 115 are brought into a non-conductive state. Therefore, accumulation of charges generated by photoelectric conversion in the photoelectric conversion units 101 and 102 is started.

At this time, different voltages are alternately applied to the first voltage application unit 103 and the second voltage application unit 104. For example, 1.5 V and 0 V are applied to the first voltage application unit 103 and the second voltage application unit 104, respectively. Therefore, the first voltage application unit 103 has a high potential. Charges (electrons) generated by photoelectric conversion move to and are accumulated in the first charge detection unit 121 of the photoelectric conversion unit 101. Next, the voltages to be applied are switched, and 0 V and 1.5 V are applied to the first voltage application unit 103 and the second voltage application unit 104, respectively. The second voltage application unit 104 has a high potential, and charges (electrons) generated by photoelectric conversion move to and are accumulated in the second charge detection unit 122 of the photoelectric conversion unit 102. The application of the voltage twice is repeated a plurality of times as one cycle, and charges are accumulated in the first charge detection unit 121 and the second charge detection unit 122.

Next, the MOS transistors 112 and 116 are made conductive, and the charges accumulated in the first charge detection unit 121 of the photoelectric conversion unit 101 and the second charge detection unit 122 of the photoelectric conversion unit 102 are transferred to and held in the charge holding units 105 and 106, respectively. The MOS transistors 113 and 117 generate image signals corresponding to the charges held in the charge holding units 105 and 106, respectively. Thereafter, when the MOS transistors 114 and 118 are made conductive, the image signals generated by the MOS transistors 113 and 117 are output to the signal lines Vo1 and Vo2, respectively. Note that the MOS transistors 111 to 118 and the charge holding units 105 and 106 constitute the above-described pixel circuit.

[Configuration of Distance Measuring Device]

Figure 10:
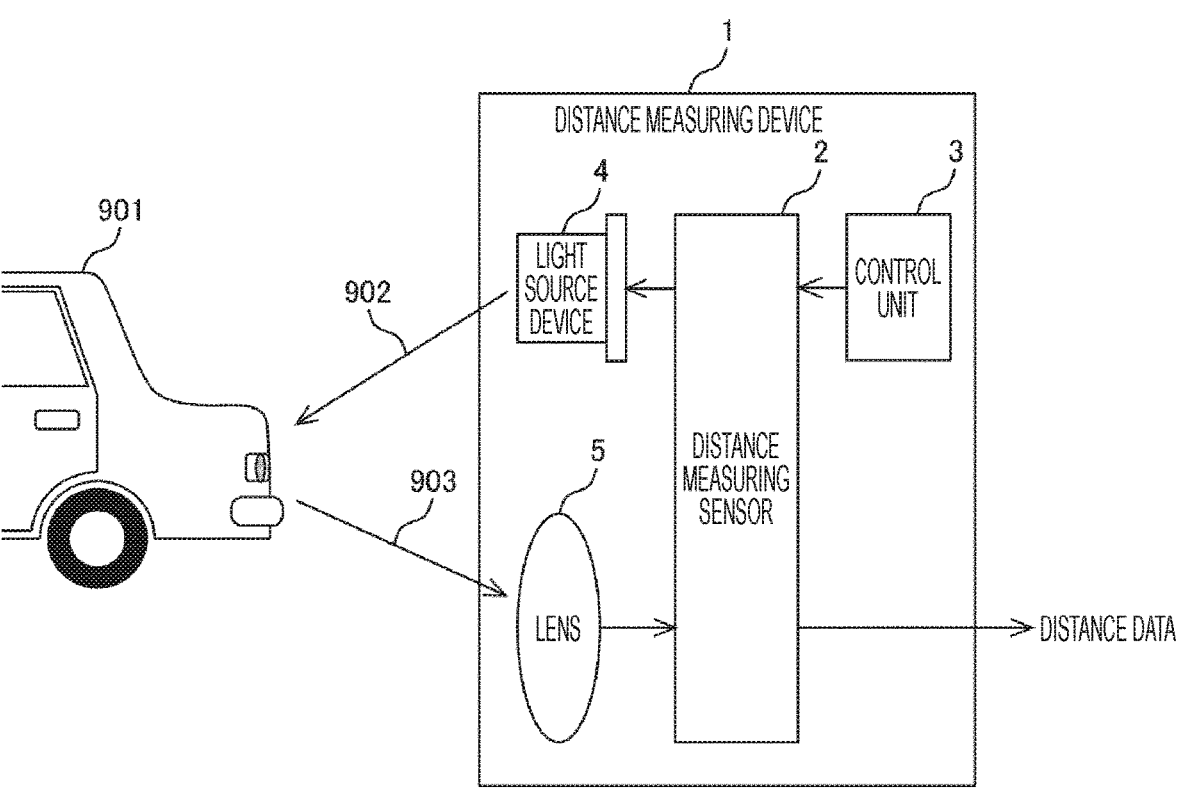
FIG. 10 is a diagram illustrating a configuration example of a distance measuring device to which the technology according to the present disclosure can be applied.

FIG. 10 is a diagram illustrating a configuration example of a distance measuring device to which the technology according to the present disclosure can be applied. The drawing is a block diagram illustrating a configuration example of a distance measuring device 1. The distance measuring device 1 in the drawing includes a distance measuring sensor 2, a control unit 3, a light source device 4, and a lens 5. Note that an object 901 for distance measurement is illustrated in the drawing. Furthermore, the distance measuring sensor 2 includes the light receiving element 20 and the light reception signal processing unit 30 described in FIG. 1.

The lens 5 is a lens that forms an image of an object on the distance measuring sensor 2.

The light source device 4 emits light to an object for distance measurement. The light source device 4 can use, for example, a laser light source that emits infrared light.

The control unit 3 controls the entire distance measuring device 1.

The distance measuring sensor 2 is a sensor that measures a distance to an object. The distance measuring sensor 2 controls the light source device 4 to emit emitted light 902 to the object 901. The emitted light 902 is reflected from the object 901 to become reflected light 903. When detecting the reflected light 903, the distance measuring sensor 2 clocks the time from the emission of the emitted light 902 to the detection of the reflected light 903, and measures the distance to the object 901. The measured distance is output as distance data to the outside of the distance measuring device 1.

Figure 11A:
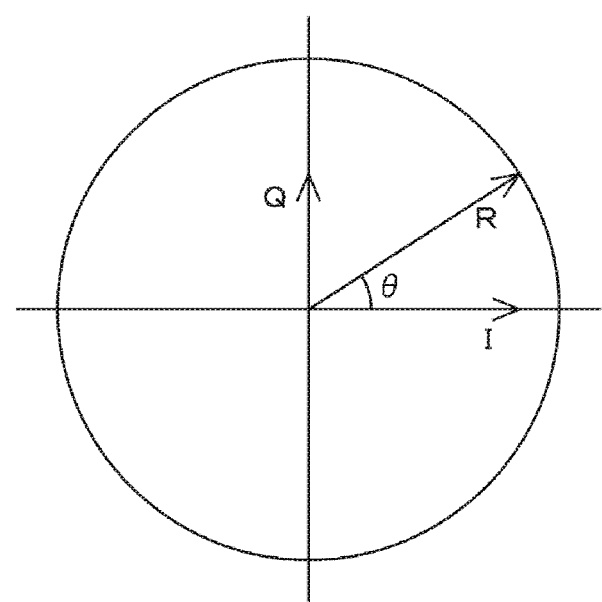
FIGS. 11A and 11B are diagrams illustrating an example of distance measurement according to a distance measuring device to which the technology according to the present disclosure can be applied.
Figure 11B:
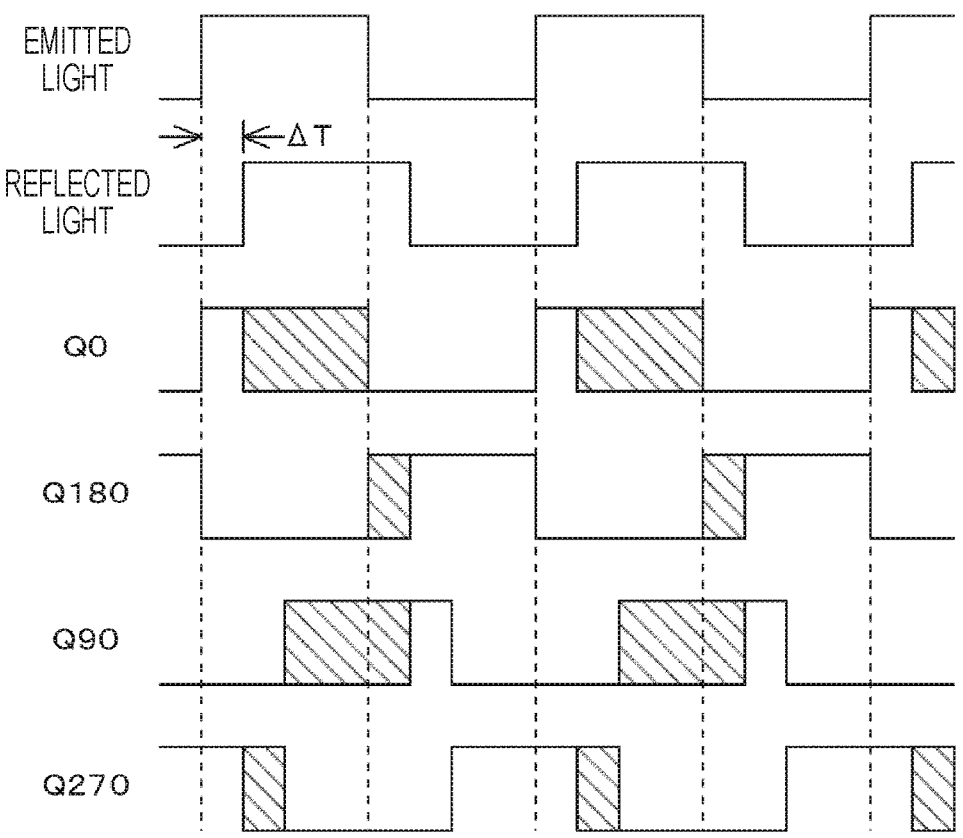

[Distance Measuring Process] FIGS. 11A and 11B are diagrams illustrating an example of distance measurement according to a distance measuring device to which the technology according to the present disclosure can be applied. FIG. 11A is a diagram illustrating a relationship between the emitted light emitted from the light source device 4 and the reflected light reflected by the object. In FIG. 11A, the positive direction of the x-axis corresponds to the phase of the emitted light. "R" in FIG. 11A represents reflected light. A phase difference $\theta$ corresponding to the distance is generated between the emitted light and the reflected light R. By detecting the phase difference $\theta$, the distance to the object can be measured. Here, I represents a component having the same phase as that of the emitted light, and Q represents a component orthogonal to the emitted light. The phase difference $\theta$ can be expressed by the following formula.

$$\theta = \arctan(Q/I)$$

Here, I represents a peak value of the reflected light having the same phase as that of the emitted light. Q represents a peak value of the reflected light orthogonal to the emitted light. FIG. 11A assumes emitted light of a sine wave or the like, but $\theta$ can be calculated by the above-described formula also for emitted light of a pulse wave or the like. Q and I can be obtained by modulating the reflected light. Specifically, the detection can be performed by detecting the reflected light at a plurality of timings having phases different from each other by 90 degrees with respect to the emitted light. FIG. 11B illustrates this state.

The "emitted light" and the "reflected light" in FIG. 11B represent waveforms of the emitted light and the reflected light, respectively. The reflected light has a waveform delayed by $\Delta T$ with respect to the emitted light. This $\Delta T$ is the time for reciprocating with the object. The distance D to the object can be expressed by the following formula.

$$D = c \times \Delta T/2 = c \times \theta/(4\pi \times f)$$

Here, c represents the speed of light. f represents the frequency of the emitted light.

Furthermore, "Q0", "Q180", "Q90", and "Q270" in FIG. 11B respectively represent a case where the reflected light is detected in phases shifted by 0, 180, 90, and 270 degrees with respect to the emitted light. The reflected light is detected in a period of a waveform value "1" such as "Q0". A hatched portion in a waveform such as "Q0" represents reflected light to be detected. By this "Q0" or the like, I and Q can be expressed as follows.

$$I = Q0 - Q180$$

$$Q = Q90 - Q270$$

Therefore, $\theta$ can be expressed by the following formula.

$$\theta = \arctan((Q90 - Q270)/(Q0 - Q180))$$

By substituting this $\theta$ into the formula described above, the distance D to the object can be calculated.

The detection of the reflected light in Q0 and Q180 and Q90 and Q270 described above can be performed by the pixel 100 described in FIG. 2. Specifically, the distribution of the first charge detection unit 121 and the second charge detection unit 122 of the pixel 100 described above is performed by corresponding to the detection periods of the reflected light in Q0 and Q180. A voltage higher than that of the second voltage application unit 104 is applied to the first voltage application unit 103 during the detection period of the reflected light in Q0, and the applied voltages of the first voltage application unit 103 and the second voltage application unit 104 are switched during the detection period of the reflected light in next Q180. Therefore, charges generated by photoelectric conversion in each period are distributed and transferred to the first charge detection unit 121 and the second charge detection unit 122. Thereafter, image signals corresponding to Q90 and Q180 can be generated by generating image signals based on the charges transferred to and accumulated in the first charge detection unit 121 and the second charge detection unit 122, respectively.

In Q90 and Q270, an image signal can be generated by a similar procedure. On the basis of these image signals, the light reception signal processing unit 30 described in FIG. 1 calculates the phase difference $\theta$ and calculates the distance D.

In this manner, the distance can be measured by the light receiving element 20 and the light reception signal processing unit 30. Note that the light reception signal processing unit 30 is an example of a processing circuit described in the claims. The distance measuring sensor 2 is an example of an electronic device described in the claims.

Finally, the description of each of the above-described embodiments is an example of the present disclosure, and the present disclosure is not limited to the above-described embodiments. For this reason, it is needless to say that various modifications other than the above-described embodiments can be made according to the design and the like without departing from the technical idea according to the present disclosure.

Furthermore, the effects described in the present specification are merely examples and are not limited. Furthermore, there may be other effects.

Furthermore, the drawings in the above-described embodiments are schematic, and dimensional ratios and the like of the respective portions do not necessarily coincide with actual ones. Furthermore, it is needless to say that the drawings include portions having different dimensional relationships and ratios.

Furthermore, the processing procedure described in the above-described embodiments may be regarded as a method including these series of procedures, and may be regarded as a program for causing a computer to execute these series of procedures or a recording medium storing the program. As this recording medium, for example, a compact disc (CD), a digital versatile disc (DVD), a memory card, and the like can be used.

Note that the present technology can also have the following configurations.

(1) A light receiving element including:

a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages;

a first charge detection unit that is arranged around the first voltage application unit on a surface of the semiconductor substrate and detects a charge generated by the photoelectric conversion; and a second charge detection unit that is arranged around the second voltage application unit on a surface of the semiconductor substrate and detects a charge generated by the photoelectric conversion.

(2) The light receiving element according to (1), in which the first voltage application unit and the second voltage application unit include protruding portions as the proximity portions.

(3) The light receiving element according to (1) or (2), in which the first voltage application unit and the second voltage application unit are configured in polygonal line shapes.

(4) The light receiving element according to (1) or (2), in which the first voltage application unit and the second voltage application unit are configured in curved linear shapes.

(5) The light receiving element according to any one of (1) to (4), in which the first voltage application unit and the second voltage application unit are arranged on a surface different from a surface of the semiconductor substrate on which the incident light is incident.

(6) An electronic device including:

a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages;

a first charge detection unit that is arranged around the first voltage application unit on a surface of the semiconductor substrate and detects a charge generated by the photoelectric conversion;

a second charge detection unit that is arranged around the second voltage application unit on a surface of the semiconductor substrate and detects a charge generated by the photoelectric conversion; and a processing circuit that performs processing on a signal generated on the basis of charges detected by the first charge detection unit and the second charge detection unit.

(7) The electronic device according to (6), in which the semiconductor substrate performs photoelectric conversion of reflected light obtained by reflecting light emitted from a light source by an object, and the processing circuit performs the processing of measuring a distance to the object by clocking a time from emission of light from the light source to incidence of the reflected light.

REFERENCE SIGNS LIST

1 Distance measuring device
2 Distance measuring sensor
4 Light source device
20 Light receiving element
21 Pixel array unit
23 Column signal processing unit
30 Light reception signal processing unit
100 Pixel
101, 102 Photoelectric conversion unit
103 First voltage application unit
104 Second voltage application unit
120 Semiconductor substrate
121 First charge detection unit
122 Second charge detection unit
128, 128a, 128b, 129, 129a, 129b Proximity portion
138, 138a, 138b, 139, 139a, 139b Protruding portion

The invention claimed is:

1. A light receiving element comprising:

a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages;

a first charge detection unit that is arranged around the first voltage application unit on a surface of the semiconductor substrate and detects a charge generated by the photoelectric conversion; and a second charge detection unit that is arranged around the second voltage application unit on a surface of the semiconductor substrate and detects a charge generated by the photoelectric conversion.

2. The light receiving element according to claim 1, wherein the first voltage application unit and the second voltage application unit include protruding portions as the proximity portions.

3. The light receiving element according to claim 1, wherein the first voltage application unit and the second voltage application unit are configured in polygonal line shapes.

4. The light receiving element according to claim 1, wherein the first voltage application unit and the second voltage application unit are configured in curved linear shapes.

5. The light receiving element according to claim 1, wherein the first voltage application unit and the second voltage application unit are arranged on a surface different from a surface of the semiconductor substrate on which the incident light is incident.

6. An electronic device comprising:

a first voltage application unit and a second voltage application unit configured in linear shapes extending in a same direction on a surface of a semiconductor substrate that performs photoelectric conversion of incident light, the first voltage application unit and the second voltage application unit being arranged apart from each other, the first voltage application unit and the second voltage application unit being provided with proximity portions and applied with different voltages;

a first charge detection unit that is arranged around the first voltage application unit on a surface of the semiconductor substrate and detects a charge generated by the photoelectric conversion;

a second charge detection unit that is arranged around the second voltage application unit on a surface of the semiconductor substrate and detects a charge generated by the photoelectric conversion; and a processing circuit that performs processing on a signal generated on a basis of charges detected by the first charge detection unit and the second charge detection unit.

7. The electronic device according to claim 6, wherein the semiconductor substrate performs photoelectric conversion of reflected light obtained by reflecting light emitted from a light source by an object, and the processing circuit performs the processing of measuring a distance to the object by clocking a time from emission of light from the light source to incidence of the reflected light.

\* \* \* \* \*